(12) United States Patent
Shiga

(10) Patent No.: US 12,401,171 B2
(45) Date of Patent: Aug. 26, 2025

(54) LASER DEVICE, LASER OSCILLATION METHOD, AND ELECTRONIC DEVICE MANUFACTURING METHOD

(71) Applicant: Gigaphoton Inc., Tochigi (JP)

(72) Inventor: Takashi Shiga, Oyama (JP)

(73) Assignee: Gigaphoton Inc., Tochigi (JP)

( * ) Notice: Subject to any disclaimer, the term of this patent is extended or adjusted under 35 U.S.C. 154(b) by 168 days.

(21) Appl. No.: 18/504,532

(22) Filed: Nov. 8, 2023

(65) Prior Publication Data

US 2024/0079844 A1 Mar. 7, 2024

Related U.S. Application Data

(63) Continuation of application No. PCT/JP2021/021685, filed on Jun. 8, 2021.

(51) Int. Cl.
*H01S 3/13* (2006.01)
*G03F 7/00* (2006.01)
(Continued)

(52) U.S. Cl.
CPC ........ *H01S 3/1301* (2013.01); *G03F 7/70025* (2013.01); *H01S 3/10069* (2013.01); *H01S 3/225* (2013.01); *H01S 3/2316* (2013.01)

(58) Field of Classification Search
CPC .... H01S 3/1301; H01S 3/10069; H01S 3/225; H01S 3/2316; H01S 3/08004;
(Continued)

(56) References Cited

U.S. PATENT DOCUMENTS 4,410,992 A 10/1983 Javan
7,903,700 B2 3/2011 Nagai et al.
(Continued)

FOREIGN PATENT DOCUMENTS

JP 2005-252147 A 9/2005
JP 2009-099727 A 5/2009
(Continued)

OTHER PUBLICATIONS

International Search Report issued in PCT/JP2021/021685; mailed Aug. 17, 2021.
(Continued)

*Primary Examiner* — Mesfin T Asfaw
(74) *Attorney, Agent, or Firm* — Studebaker Brackett PLLC

(57) ABSTRACT

A laser device includes a master oscillator outputting pulse laser light at a first discharge timing synchronized with a repetition frequency; an amplifier amplifying the pulse laser light by exciting, at a second discharge timing, a laser medium through which the pulse laser light passes; and a processor setting the second discharge timing by adding a delay time to the first discharge timing, holding a first value as a command value of the delay time corresponding to a first repetition frequency, holding a second value as the command value of the delay time corresponding to a second repetition frequency, and outputting the command value of the second value after outputting the command value of a third value between the first value and the second value when the repetition frequency is changed from the first repetition frequency to the second repetition frequency after outputting the command value of the first value.

18 Claims, 10 Drawing Sheets

(51) Int. Cl.
*H01S 3/10* (2006.01)
*H01S 3/225* (2006.01)
*H01S 3/23* (2006.01)

(58) Field of Classification Search
CPC ............... H01S 3/08009; H01S 3/1055; H01S 3/10038; H01S 3/10046; H01S 3/1306; H01S 3/2333; H01S 3/104; G03F 7/70025; G03F 7/20; H01L 21/027
See application file for complete search history.

(56) References Cited

U.S. PATENT DOCUMENTS

| | | |
|---|---|---|
| 2012/0243565 A1 | 9/2012 | Onose et al. |
| 2018/0123312 A1 | 5/2018 | Furusato et al. |
| 2018/0375283 A1 | 12/2018 | Kurosawa |

FOREIGN PATENT DOCUMENTS

| | | |
|---|---|---|
| JP | 2012-044098 A | 3/2012 |
| JP | 2012-199425 A | 10/2012 |
| JP | 2018-517278 A | 6/2018 |
| WO | 2016/164157 A1 | 10/2016 |
| WO | 2017/026000 A1 | 2/2017 |
| WO | 2017/149712 A1 | 9/2017 |

OTHER PUBLICATIONS

International Search Report and Written Opinion issued in PCT/JP2021/021685; issued Nov. 21, 2023.

| RR | ΔD |
|----|----|
| RR1 | ΔD1 |
| RR2 | ΔD2 |
| ⋮ | |

LASER DEVICE, LASER OSCILLATION METHOD, AND ELECTRONIC DEVICE MANUFACTURING METHOD

CROSS-REFERENCE TO RELATED APPLICATIONS

The present application claims the benefit of International Application No. PCT/JP2021/021685, filed on Jun. 8, 2021, the entire contents of which are hereby incorporated by reference.

BACKGROUND

1. Technical Field

The present disclosure relates to a laser device, a laser oscillation method, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used. The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 7,903,700
Patent Document 2: Japanese Patent Application Publication No. 2012-44098

SUMMARY

A laser device according to an aspect of the present disclosure includes a master oscillator configured to output pulse laser light at a first discharge timing synchronized with a repetition frequency; an amplifier configured to amplify the pulse laser light by exciting, at a second discharge timing, a laser medium through which the pulse laser light passes; and a processor configured to set the second discharge timing by adding a delay time to the first discharge timing, hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

A laser oscillation method according to another aspect of the present disclosure includes outputting pulse laser light from a master oscillator at a first discharge timing synchronized with a repetition frequency; amplifying the pulse laser light by exciting, at a second discharge timing, a laser medium through which the pulse laser light passes; and setting, by a processor, the second discharge timing by adding a delay time to the first discharge timing. Here, the processor is configured to hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

An electronic device manufacturing method according to another aspect of the present disclosure includes generating laser light using a laser device, outputting the laser light to an exposure apparatus, and exposing a photosensitive substrate to the laser light in the exposure apparatus to manufacture an electronic device. Here, the laser device includes a master oscillator configured to output pulse laser light at a first discharge timing synchronized with a repetition frequency; an amplifier configured to amplify the pulse laser light by exciting, at a second discharge timing, a laser medium through which the pulse laser light passes; and a processor configured to set the second discharge timing by adding a delay time to the first discharge timing, hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

BRIEF DESCRIPTION OF THE DRAWINGS

Embodiments of the present disclosure will be described below merely as examples with reference to the accompanying drawings.

DESCRIPTION OF EMBODIMENTS

Figure 1:
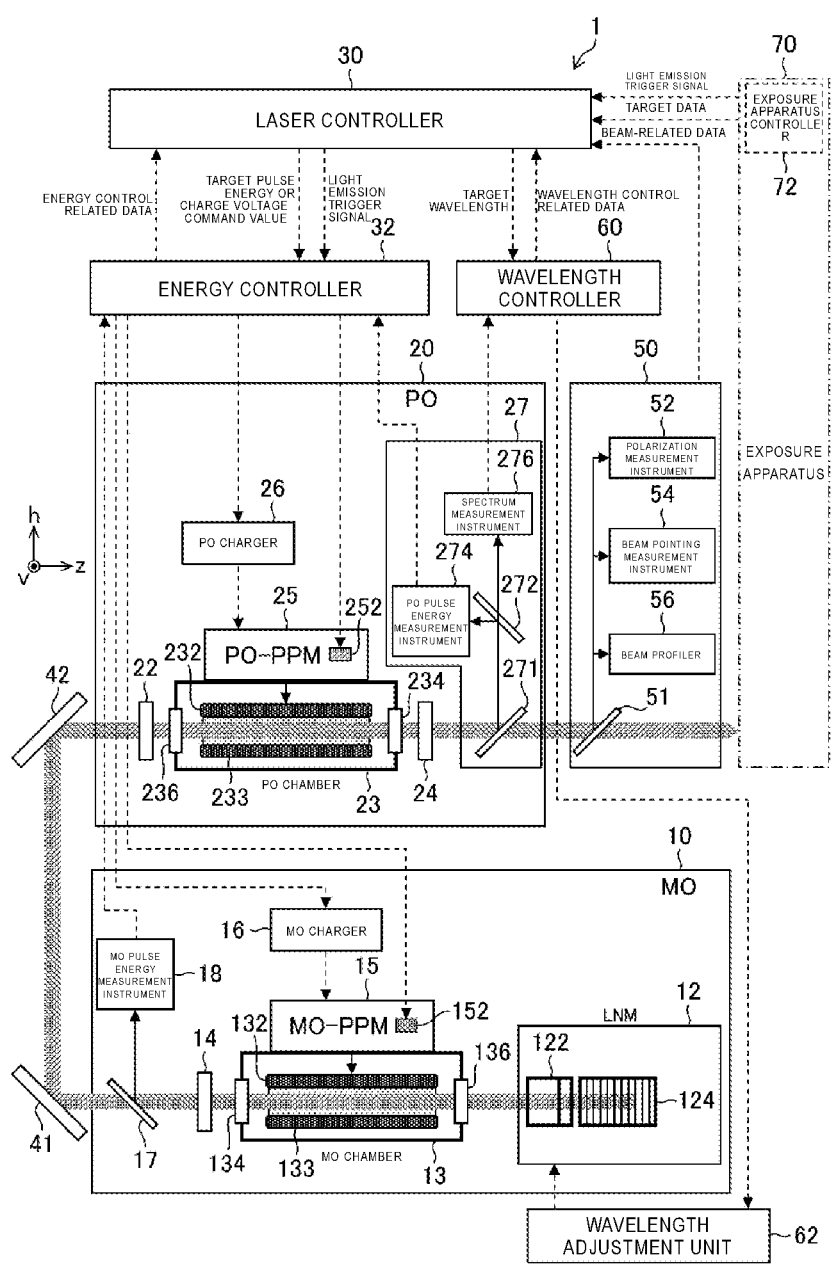
FIG. 1 schematically shows a configuration example of a laser device.

<Contents>
1. Overview of laser device
   1.1 Configuration
   1.2 Operation
   1.3 Characteristic of line narrowing laser
   1.4 Control when repetition frequency is changed
2. Problem
3. First Embodiment
   3.1 Configuration
   3.2 Operation
   3.3 Effect
4. Second Embodiment
   4.1 Configuration
   4.2 Operation
   4.3 Effect
5. Third Embodiment
   5.1 Configuration
   5.2 Operation
   5.3 Effect
6. Other application examples
7. Electronic device manufacturing method
8. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure.

Here, the same components are denoted by the same reference numeral, and duplicate description thereof is omitted.

1. Overview of Laser Device 1.1 Configuration

FIG. 1 schematically shows a configuration example of a laser device 1. The laser device 1 is an excimer laser device including a master oscillator (MO) 10, a power oscillator (PO) 20, a laser controller 30, and an energy controller 32. The laser device 1 may include high reflection mirrors 41, 42, a beam measurement instrument 50, a wavelength controller 60, and a wavelength adjustment unit 62.

The master oscillator 10 includes a line narrowing module (LNM) 12, an MO chamber 13, an MO output coupling mirror 14, an MO pulse power module (PPM) 15, and an MO charger 16. The LNM 12 includes a prism 122 for narrowing the spectral line width and a grating 124. The grating 124 is arranged in the Littrow arrangement so that the incident angle and the diffraction angle coincide with each other.

The MO output coupling mirror 14 may be a partial reflection mirror having a reflectance of 20% to 30%. The MO output coupling mirror 14 is arranged to configure an optical resonator together with the LNM 12.

The MO chamber 13 is arranged on the optical path of the optical resonator. The MO chamber 13 includes a pair of discharge electrodes 132, 133 and two windows 134, 136 through which the laser light is transmitted. A laser gas is supplied from a gas supply device (not shown) into the MO chamber 13. The laser gas is an excimer laser gas including a rare gas, a halogen gas, and a buffer gas. The rare gas may be, for example, an argon (Ar) gas or a krypton (Kr) gas. The halogen gas may be, for example, a fluorine ($F_2$) gas. The buffer gas may be, for example, a neon (Ne) gas.

The MO pulse power module 15 includes a switch 152 and a charging capacitor (not shown), and is connected to the discharge electrode 132 via a feedthrough of an electrically insulating member (not shown). The discharge electrode 133 is connected to the MO chamber 13 that is grounded. The MO charger 16 charges the charging capacitor of the MO pulse power module 15 in accordance with a command from the energy controller 32.

The master oscillator 10 includes a beam splitter 17 and an MO pulse energy measurement instrument 18. The beam splitter 17 is arranged on the optical path of the laser light output from the MO output coupling mirror 14. The beam splitter 17 is arranged so that the reflection light of the beam splitter 17 enters the MO pulse energy measurement instrument 18. The MO pulse energy measurement instrument 18 includes a light concentrating lens (not shown) and an optical sensor (not shown). The optical sensor may be a fast-response photodiode that is resistant to ultraviolet light. A signal line for transmitting information obtained by the MO pulse energy measurement instrument 18 to the energy controller 32 is provided between the MO pulse energy measurement instrument 18 and the energy controller 32.

The pulse laser light transmitted through the beam splitter 17 is output from the master oscillator 10.

The high reflection mirror 41 and the high reflection mirror 42 are arranged on the optical path between the master oscillator 10 and the power oscillator 20 so that the laser light output from the master oscillator 10 enters the power oscillator 20.

The power oscillator 20 is an excimer amplifier that includes a rear mirror 22, a PO chamber 23, a PO output coupling mirror 24, a PO pulse power module 25, a PO charger 26, and a monitor module 27.

The rear mirror 22 and the PO output coupling mirror 24 configure an optical resonator, and the PO chamber 23 is arranged on the optical path of the optical resonator.

The configuration of the PO chamber 23 may be similar to that of the MO chamber 13. The PO chamber 23 includes a pair of discharge electrodes 232, 233 and two windows 234, 236. A laser gas is supplied into the PO chamber 23 in a similar manner as the MO chamber 13. The rear mirror 22 may be a partial reflection mirror having a reflectance of, for example, 80% to 90%. The PO output coupling mirror 24 may be a partial reflection mirror having a reflectance of 20% to 30%.

The PO pulse power module 25 includes a switch 252 and a charging capacitor (not shown), and is connected to the discharge electrode 232 via a feedthrough of an electrically insulating member (not shown). The discharge electrode 233 is connected to the PO chamber 23 that is grounded. The PO charger 26 charges the charging capacitor of the PO pulse power module 25 in accordance with a command from the energy controller 32.

In FIG. 1, the optical path axis direction of the laser light output from the power oscillator 20 is a z direction. The two directions substantially orthogonal to the z direction may be an h direction and a v direction. The v direction is a direction substantially orthogonal to the paper surface of FIG. 1. The discharge electrodes 232, 233 are arranged to face each other in the h direction.

The monitor module 27 includes beam splitters 271, 272, a PO pulse energy measurement instrument 274, and a spectrum measurement instrument 276.

The beam splitter 271 is arranged on the optical path of the pulse laser light output from PO output coupling mirror 24. The beam splitter 272 is arranged on the optical path of the pulse laser light reflected by the beam splitter 271. The beam splitter 272 is arranged such that the reflection light of the beam splitter 272 enters the PO pulse energy measurement instrument 274 and the transmission light of the beam splitter 272 enters the spectrum measurement instrument 276. The configuration of the PO pulse energy measurement instrument 274 may be similar to that of the MO pulse energy measurement instrument 18.

A signal line for transmitting information obtained by the PO pulse energy measurement instrument 274 to the energy controller 32 is provided between the PO pulse energy measurement instrument 274 and the energy controller 32.

The spectrum measurement instrument 276 may be, for example, an etalon spectrometer including an etalon (not shown), a light concentrating lens (not shown), and an image sensor (not shown). The interference fringes generated by the light concentrating lens on a focal plane thereof due to transmission through the etalon are measured using an image sensor. A signal line for transmitting information obtained by the spectrum measurement instrument 276 to the wavelength controller 60 is provided between the spectrum measurement instrument 276 and the wavelength controller 60.

The beam measurement instrument 50 includes a beam splitter 51, a polarization measurement instrument 52, a beam pointing measurement instrument 54, and a beam profiler 56. The beam splitter 51 is arranged on the optical path of the pulse laser light transmitted through the beam splitter 271 of the monitor module 27.

The beam splitter 51 is arranged such that the reflection light of the beam splitter 51 enters each of the polarization measurement instrument 52, the beam pointing measurement instrument 54, and the beam profiler 56 via an optical element (not shown), and the transmission light of the beam splitter 51 enters an exposure apparatus 70. A signal line for transmitting beam-related data obtained by the beam measurement instrument 50 to the laser controller 30 is provided between the beam measurement instrument 50 and the laser controller 30.

The laser controller 30 is connected to the energy controller 32 and the wavelength controller 60. The energy controller 32 is connected to the master oscillator 10 and the power oscillator 20. The energy controller 32 transmits charge voltage data to the MO charger 16 based on the pulse energy detected by the MO pulse energy measurement instrument 18, and controls the voltage to be charged to the charging capacitor of the MO pulse power module 15. Further, the energy controller 32 transmits charge voltage data to the PO charger 26 based on the pulse energy detected by the PO pulse energy measurement instrument 274, and controls the voltage to be charged to the charging capacitor of the PO pulse power module 25.

The wavelength controller 60 generates wavelength control related data based on the data obtained by the spectrum measurement instrument 276, and transmits the wavelength control related data to the laser controller 30. The wavelength controller 60 is connected to the wavelength adjustment unit 62. The wavelength adjustment unit 62 includes, for example, a rotation drive mechanism such as a rotation stage that rotates the prism 122 of the LNM 12. The wavelength adjustment unit 62 is controlled based on the wavelength measured by the spectrum measurement instrument 276.

Further, the laser controller 30 is connected to the beam measurement instrument 50 and the exposure apparatus 70. The exposure apparatus 70 includes an exposure apparatus controller 72.

Each of the laser controller 30, the energy controller 32, the wavelength controller 60, the exposure apparatus controller 72, and other controllers are configured by using at least one processor. The processor of the present disclosure is a processing device including a storage device in which a control program is stored and a central processing unit (CPU) that executes the control program. The processor is specifically configured or programmed to perform various processes included in the present disclosure. The processor may include an integrated circuit such as a field programmable gate array (FPGA) or an application specific integrated circuit (ASIC).

Each of the laser controller 30, the energy controller 32, and the wavelength controller 60 may be realized by a separate processor, or the processing functions of a plurality of controllers may be realized by a single processor.

1.2 Operation

The laser controller 30 receives a light emission trigger signal and/or target data from the exposure apparatus 70. The target data may be a target pulse energy and/or a charge voltage command value. The laser controller 30 outputs a light emission trigger signal, and a target pulse energy and/or a charge voltage command value to the energy controller 32.

The energy controller 32 may determine an MO charge voltage and/or a PO charge voltage based on the target pulse energy and/or the charge voltage command value. The energy controller 32 outputs a first trigger signal synchronized with the light emission trigger signal, and the MO charge voltage to the master oscillator 10. The first trigger signal is a signal that defines the MO charge timing. The master oscillator 10 may output seed laser light in synchronization with the first trigger signal. The seed laser light output from the master oscillator 10 is line narrowed.

The seed laser light output from the master oscillator 10 may enter the power oscillator 20 via the high reflection mirrors 41, 42.

The energy controller 32 outputs a second trigger signal synchronized with the light emission trigger signal, and the PO charge voltage to the power oscillator 20. The second trigger signal is generated to have a delay time with respect to the first trigger signal. The second trigger signal is a signal that defines the PO discharge timing. The PO discharge timing is a timing obtained by adding the delay time to MO discharge timing. The power oscillator 20 may form a discharge region in synchronization with the second trigger signal. The seed laser light having entered the power oscillator 20 is amplified by passing through the discharge region of the PO chamber 23. The power oscillator 20 may amplify the entered seed laser light at the discharge region and output output laser light.

1.3 Characteristic of Line Narrowing Laser

Figure 2:
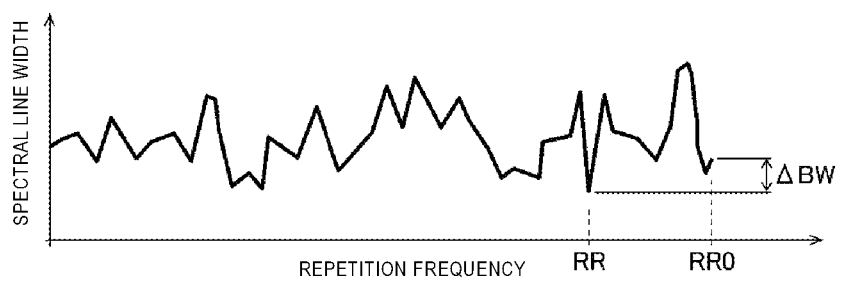
FIG. 2 is an example of a graph showing the relationship between the repetition frequency and the spectral line width.

The characteristics of the output laser light output from the power oscillator 20 varies depending on the repetition frequency. FIG. 2 is an example of a graph showing the relationship between the repetition frequency and the spectral line width. For example, as shown in FIG. 2, the spectral line width varies in a complex manner with respect to the repetition frequency. Therefore, when the repetition frequency changes from a nominal value RR0 to a certain value RR, the spectral line width changes by ΔBW. Further, the characteristics of the output laser light output from the power oscillator 20 varies depending on a delay time D between the MO discharge timing and the PO discharge timing.

Figure 3:
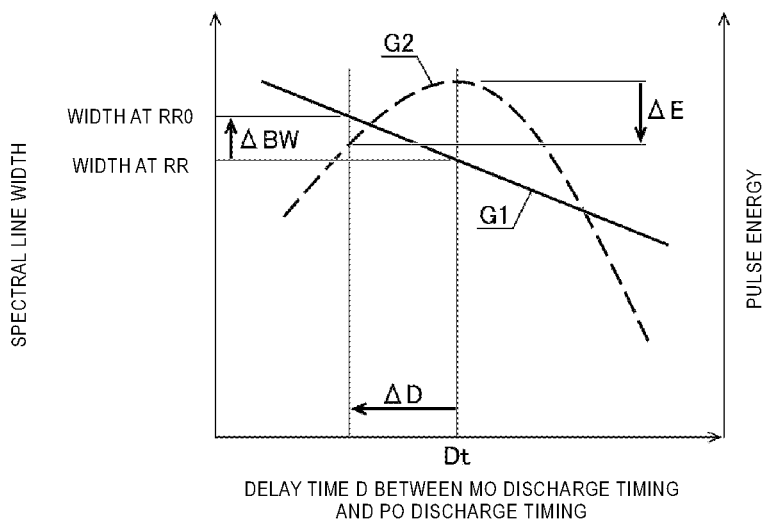
FIG. 3 is an example of a graph showing the relationship between a delay time, between a master oscillator (MO) discharge timing and a power oscillator (PO) discharge timing, and each of the spectral line width and the pulse energy.

FIG. 3 is an example of a graph showing the relationship between the delay time D, between the MO discharge timing and the PO discharge timing, and each of the spectral line width and the pulse energy. In FIG. 3, the horizontal axis represents the delay time D, the vertical axis on the left of FIG. 3 represents the spectral line width, and the vertical axis on the right represents the pulse energy. A graph G1 indicated by a solid line in FIG. 3 shows the relationship between the delay time D and the spectral line width. A graph G2 indicated by a broken line in FIG. 3 shows the relationship between the delay time D and the pulse energy. As shown in FIG. 3, for example, the spectral line width decreases as the delay time D increases. The pulse energy has a maximal value with respect to the delay time D. The laser device 1 operates with the delay time D that takes the maximal value as a nominal value Dt.

When the repetition frequency is changed from RR0 to RR, the laser controller 30 corrects the change amount ΔBW of the spectral line width that occurs when the repetition frequency is changed, using the characteristic shown in FIG. 3. That is, ΔBW at a certain repetition frequency RR can be found from the characteristic shown in FIG. 2. Further, from the characteristic shown in FIG. 3, it can be seen that the delay time D may be changed from the nominal value Dt by the delay time change amount ΔD to cancel ΔBW or cause ΔBW to be reduced.

Figures 4, 5:
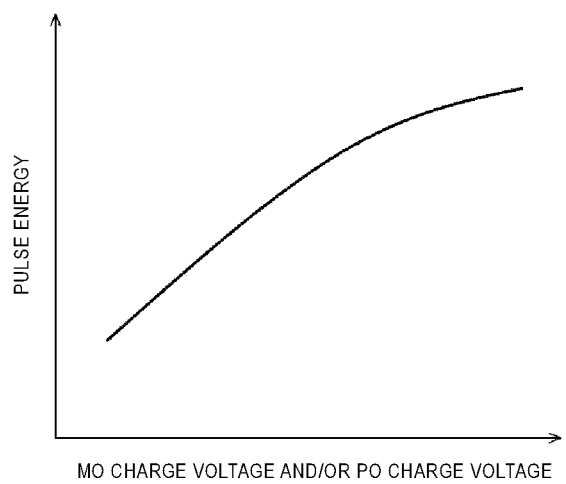
FIG. 4 is an example of a table that defines the correspondence relationship between the repetition frequency and a delay time change amount.
FIG. 5 is an example of a graph showing the relationship between an MO charge voltage and/or a PO charge voltage and the pulse energy.

As a result, as shown in FIG. 4, a table is obtained in which the repetition frequency RR and the delay time change amount ΔD are associated with each other. The laser device 1 holds the data of this table.

On the other hand, the characteristics of the output laser light is also changed by the MO charge voltage and/or the PO charge voltage, and the pulse energy shows the characteristic as shown in FIG. 5. The characteristic shown in FIG. 5 is used to stabilize the pulse energy. For example, when the laser light is output to the exposure apparatus 70, the pulse energy is feedback controlled and stabilized within a target range by adjusting the MO charge voltage and/or the PO charge voltage. This is referred to as HV control.

When the delay time D is changed by ΔD to maintain the spectral line width in response to a change in the repetition frequency from RR0 to RR, the pulse energy is fluctuated by ΔE (FIG. 3). The HV control serves to compensate this energy fluctuation.

1.4 Control when Repetition Frequency is Changed

Figure 6:
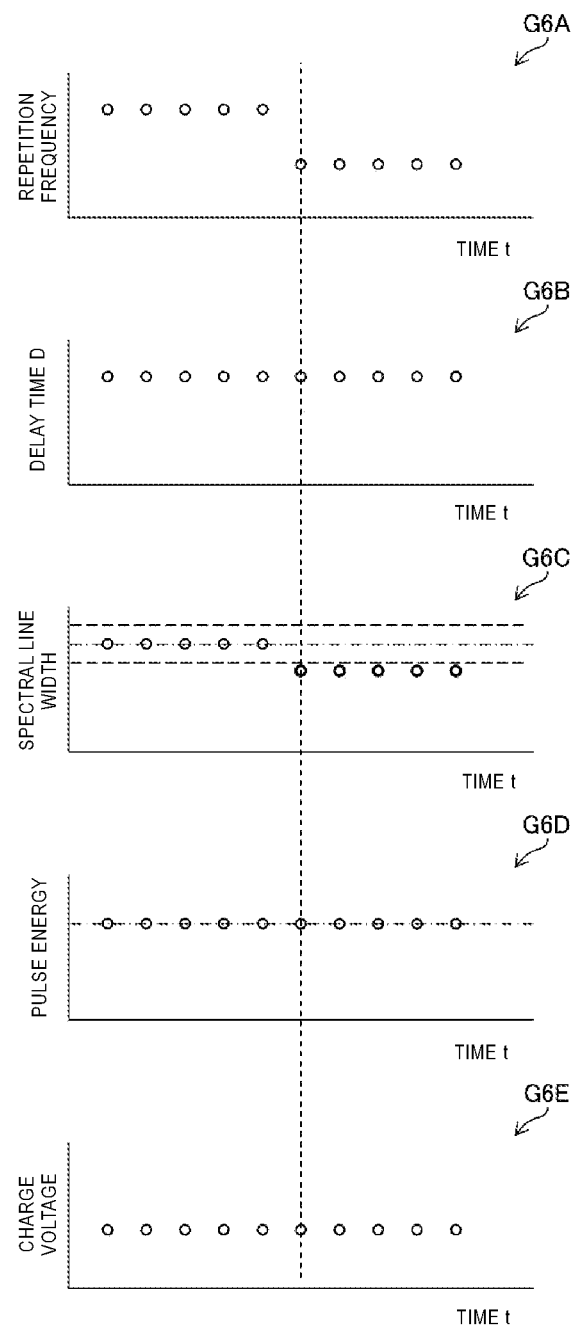
FIG. 6 is an example of graphs showing the operation of the laser device when the control of a first comparative example is applied.

FIG. 6 is an example of graphs showing the operation of the laser device 1 when the control of a first comparative example is applied. The comparative examples of the present disclosure are examples recognized by the applicant as known only by the applicant, and are not publicly known examples admitted by the applicant.

Figure 7:
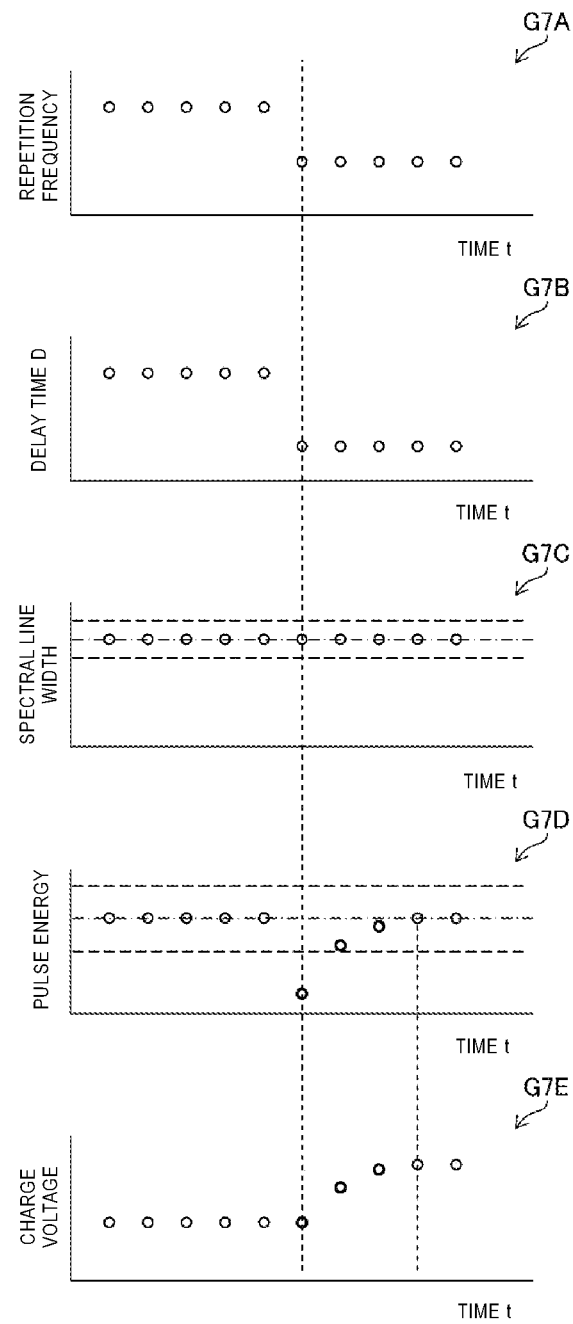
FIG. 7 is an example of graphs showing the operation of the laser device when the control of a second comparative example including compensation control of the spectral line width using the characteristic shown in FIG. 3 is applied.
Figure 8:
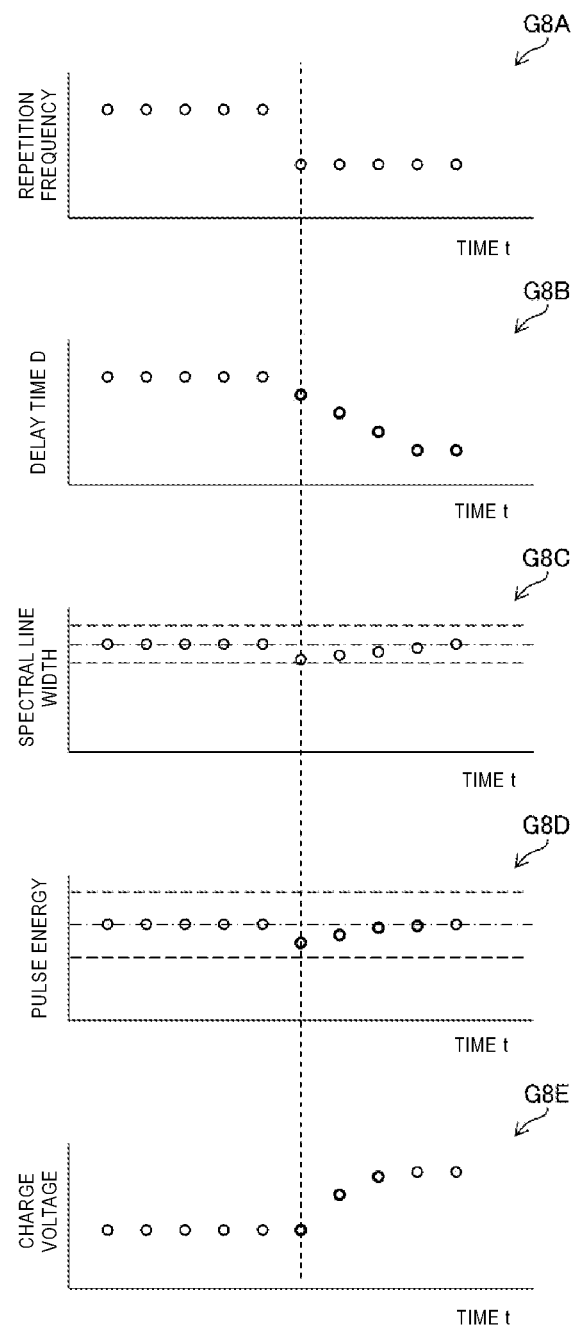
FIG. 8 is an example of graphs showing the operation of the laser device according to a first embodiment.

In FIG. 6, graphs G6A to G6E showing the transition of the values of the respective parameters of the repetition frequency, the delay time D, the spectral line width, the pulse energy, and the charge voltage from the top are shown with a common time axis. Here, the charge voltage may be the MO charge voltage, the PO charge voltage, or a combination of the MO charge voltage and the PO charge voltage. In FIGS. 6 to 8, the charge voltage is assumed to be the PO charge voltage.

The exposure apparatus 70 may instruct the laser device 1 to change the repetition frequency to adjust the exposure amount (graph G6A).

When the repetition frequency is changed, the spectral line width may deviate from a predetermined allowable range due to the characteristic shown in FIG. 2 (graph G6C). In graph G6C, a range of the spectral line width indicated by broken lines represents the predetermined allowable range.

FIG. 7 is an example of graphs showing the operation of the laser device 1 when the control of a second comparative example including the compensation control of the spectral line width using the characteristic shown in FIG. 3 is applied. In FIG. 7, similarly to FIG. 6, graphs G7A to G7E showing the transition of the values of the respective parameters of the repetition frequency, the delay time D, the spectral line width, the pulse energy, and the charge voltage from the top are shown with a common time axis.

In the second comparative example, the laser controller 30 determines the delay time change amount ΔD corresponding to RR which is the changed repetition frequency from the data of the table shown in FIG. 4, and changes the delay time D between the MO discharge timing and the PO discharge timing by ΔD (graph G6B of FIG. 6 to graph G7B of FIG. 7).

As a result, as shown in graph G7C, it is possible to suppress the fluctuation in the spectral line width due to the change in the repetition frequency. On the other hand, when the delay time D is changed, the pulse energy also changes according to the characteristic shown in FIG. 3. Therefore, in some cases, the pulse energy may deviate from the target range (graph G7D). In graph G7D, a range of the pulse energy indicated by broken lines represents the target range. To suppress such deviation of the pulse energy from the target range, the laser controller 30 performs the HV control based on the characteristic shown in FIG. 5. That is, the laser controller 30 adjusts the charge voltage as shown in graph G7E of FIG. 7. As a result, the pulse energy returns into the target range (graph G7D).

However, as in a time range (period) indicated by broken lines on the time axis of graph G7D, pulses oscillated with the pulse energy out of the target range may occur until settlement by the HV control (graph G7D).

2. Problem

When the delay time D is rapidly changed, it takes time until the settlement by the HV control. As a result, as described with reference to FIG. 7, a time period in which the laser light having the pulse energy deviating from the target range is output may occur. During this time period, energy stability and dose stability may be deteriorated. Here, although the change of the repetition frequency has been described as an example, not limited to the above, a similar problem occurring when the delay time D is changed occurs even when another operation condition is changed.

3. First Embodiment

3.1 Configuration

The configuration of the laser device 1 according to a first embodiment may be similar to that shown in FIG. 1.

3.2 Operation

FIG. 8 is an example of graphs showing the operation of the laser device 1 according to the first embodiment. In FIG. 8, similarly to FIG. 6, graphs G8A to G8E showing the transition of the values of the respective parameters of the repetition frequency, the delay time D, the spectral line width, the pulse energy, and the charge voltage from the top are shown with a common time axis.

When the repetition frequency is changed, the laser controller 30 changes the delay time D between the MO discharge timing and the PO discharge timing. At this time, the delay time D is gradually changed over a plurality of pulses at a ratio of a delay time change rate $\Delta d$ (ns/pls) per pulse until the change amount of the delay time D reaches the delay time change amount $\Delta D$ as a target value corresponding to the repetition frequency RR. The delay time change rate $\Delta d$ is a change amount per pulse for changing the delay time D. The delay time change rate $\Delta d$ may be constant in a period over a plurality of pulses for changing the delay time D.

The MO discharge timing is an example of the "first discharge timing" in the present disclosure, and the PO discharge timing is an example of the "second discharge timing" in the present disclosure. The power oscillator 20 is an example of the "amplifier" in the present disclosure, and the laser gas contained in the PO chamber 23 is an example of the "laser medium" in the present disclosure.

For the 10 pulses shown in graph G8A of FIG. 8, the repetition frequency of the first half 5 pulses corresponds to RR0, and the repetition frequency of the second half 5 pulses corresponds to RR. As specific numerical values, for example, RR0 may be 6.0 kHz and RR may be 5.3 kHz. RR0 is an example of the "first repetition frequency" in the present disclosure, and RR is an example of the "second repetition frequency" in the present disclosure.

Further, the command value of the delay time D for each of the first half 5 pulses shown in graph G8B of FIG. 8 is an example of the "first value" in the present disclosure, and the command value of the delay time D for each of the ninth pulse and the tenth pulse is an example of the "second value" in the present disclosure. The command value of the delay time D for each of the sixth pulse, the seventh pulse, and the eighth pulse in graph G8B of FIG. 8 is an example of the "third value" in the present disclosure. The command value of the delay time D for each of the sixth pulse, the seventh pulse, and the eighth pulse is a value between the command value for the fifth pulse and the command value for the ninth pulse. The charge voltage shown in graph G8E of FIG. 8 is an example of the "excitation voltage" in the present disclosure.

Figure 9:
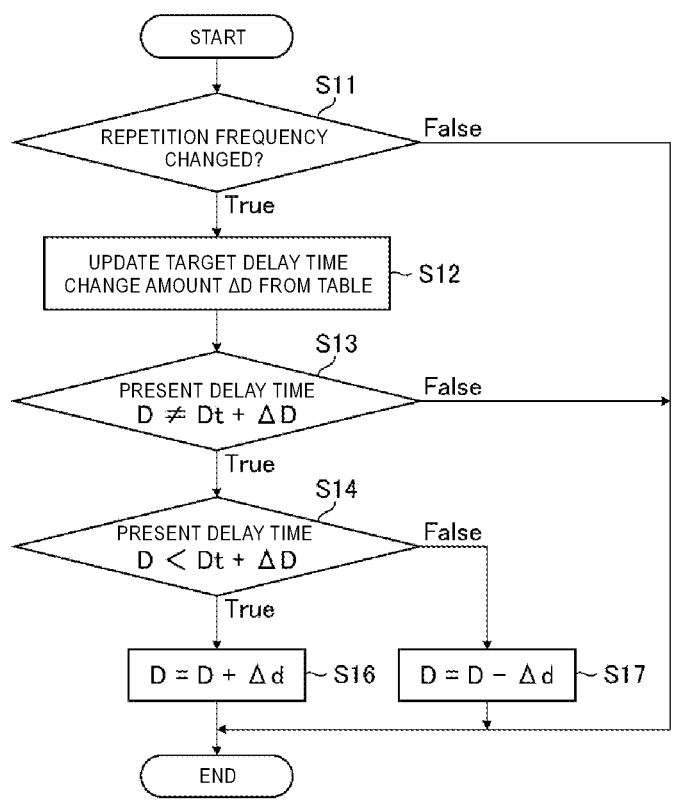
FIG. 9 is a flowchart showing a control example of the delay time in the laser device according to the first embodiment.

FIG. 9 is a flowchart showing a control example of the delay time D in the laser device 1 according to the first embodiment. The flowchart of FIG. 9 can be realized by the processor functioning as the laser controller 30 executing a program.

In step S11, the laser controller 30 determines whether or not the repetition frequency is changed. When the repetition frequency is changed and the determination result in step S11 is True determination, processing proceeds to step S12.

In step S12, the laser controller 30 updates the delay time change amount $\Delta D$ as the target value of the change amount of the delay time D from the table. This table may be the table as described in FIG. 4. Alternatively, the laser controller 30 may store the table data indicating the correspondence relationship between the repetition frequency and a command value of an appropriate delay time D, and determine the target delay time change amount $\Delta D$ based on the table data. The difference between the command value of the delay time D corresponding to the repetition frequency after the change and the command value of the delay time D corresponding to the repetition frequency before the change can be the target delay time change amount $\Delta D$.

Next, in step S13, the laser controller 30 determines whether or not the present delay time D does not match Dt+$\Delta D$. When the present delay time D does not match Dt+$\Delta D$ and the determination result in step S13 is True determination, processing proceeds to step S14.

In step S14, the laser controller 30 determines whether or not the present delay time D is smaller than Dt+$\Delta D$. When the present delay time D is smaller than Dt+$\Delta D$ and the determination result in step S14 is True determination, processing proceeds to step S16.

In step S16, the laser controller 30 adds $\Delta d$ to the delay time D to update the value of the present delay time D. The delay time change rate $\Delta d$ for changing the delay time D may be determined in advance based on, for example, experimental data, or may be determined in accordance with the target delay time change amount $\Delta D$. The delay time change rate $\Delta d$ is preferably set to a value at which the fluctuation of the spectral line width is within the predetermined allowable range and the pulse energy is within the target range.

On the other hand, in the determination of step S14, when the present delay time D is larger than Dt+$\Delta D$ and the determination result in step S14 is False determination, processing proceeds to step S17.

In step S17, the laser controller 30 subtracts $\Delta d$ from the delay time D to update the value of the present delay time D.

After step S16 or step S17, the laser controller 30 ends the flowchart of FIG. 9. In the determination of step S11, when the repetition frequency is not changed and the determination result in step S11 is False determination, the laser controller 30 ends the flowchart of FIG. 9. In the determination of step S13, when the present delay time D matches Dt+$\Delta D$ and the determination result in step S13 is False determination, the laser controller 30 ends the flowchart of FIG. 9.

The laser controller 30 may repeatedly execute the processing of the flowchart of FIG. 9 for each pulse.

An MOPO laser oscillation method realized by the flowchart of FIG. 9 is an example of the "laser oscillation method" in the present disclosure.

3.3 Effect

According to the laser device 1 of the first embodiment, since the delay time D is gradually changed by the target delay time change amount ΔD over a plurality of pulses when the repetition frequency is changed, the change in the pulse energy due to the change in the delay time D becomes gradual, and deviation from the target range is suppressed (graph G8D of FIG. 8). As a result, deterioration of energy stability and dose stability is suppressed.

4. Second Embodiment

4.1 Configuration

The configuration of the laser device 1 according to a second embodiment may be similar to that shown in FIG. 1.

4.2 Operation

Regarding the operation of the second embodiment, differences from that of the first embodiment will be described. In the second embodiment, in contrast with the operation described in the first embodiment, the change amount per pulse (delay time change rate Δd) constant throughout the period of the change of the delay time D over a plurality of pulses is determined based on the characteristics of the laser device 1. A detailed example is described below.

Figure 10:
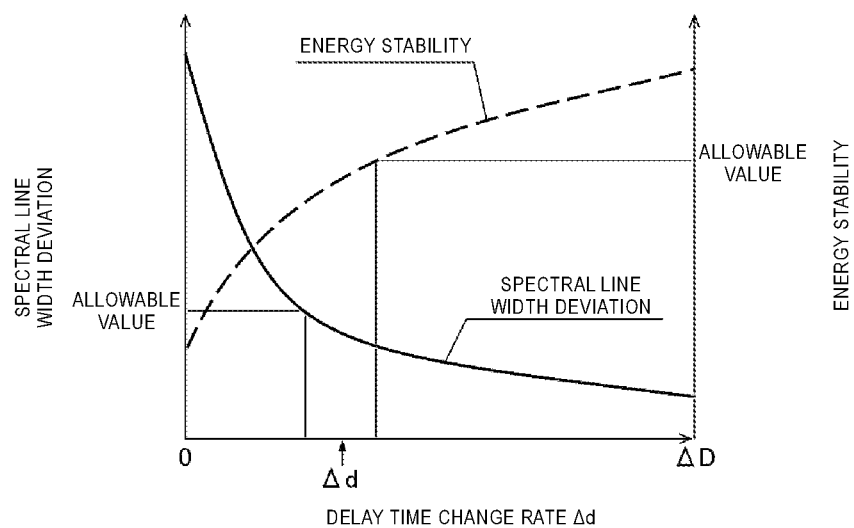
FIG. 10 is an example of a graph showing the relationship between delay time change rate and each of spectral line width deviation and energy stability, and shows an example of a case in which the delay time change rate can be set to allow the spectral line width deviation and the energy stability to have respective allowable values.

FIG. 10 is an example of a graph showing the relationship between a delay time change rate Δd and each of spectral line width deviation and energy stability. The horizontal axis represents the delay time change rate Δd, the vertical axis on the left represents the spectral line width deviation, and the vertical axis on the right represents the energy stability.

In FIG. 10, Δd=0 corresponds to a case in which the delay time D is not changed (the case of FIG. 6), and Δd=ΔD corresponds to a case in which the delay time D is changed at once (the case of FIG. 7).

The spectral line width deviation indicates the magnitude of the deviation between the average value and the target value of the spectral line width. The energy stability is an index of a variation in the pulse energy value, and the smaller the value is, the higher the stability is.

When the delay time change rate Δd decreases, the change in the pulse energy due to the delay time change becomes gradual, and the energy stability is improved (the index value of the energy stability decreases). On the other hand, the driving for the spectral line width due to the delay time change becomes slow, and the suppression of the fluctuation of the spectral line width due to the switching of the repetition frequency becomes insufficient. Therefore, the fluctuation in the spectral line width increases, and the value of the spectral line width deviation increases.

Figure 11:
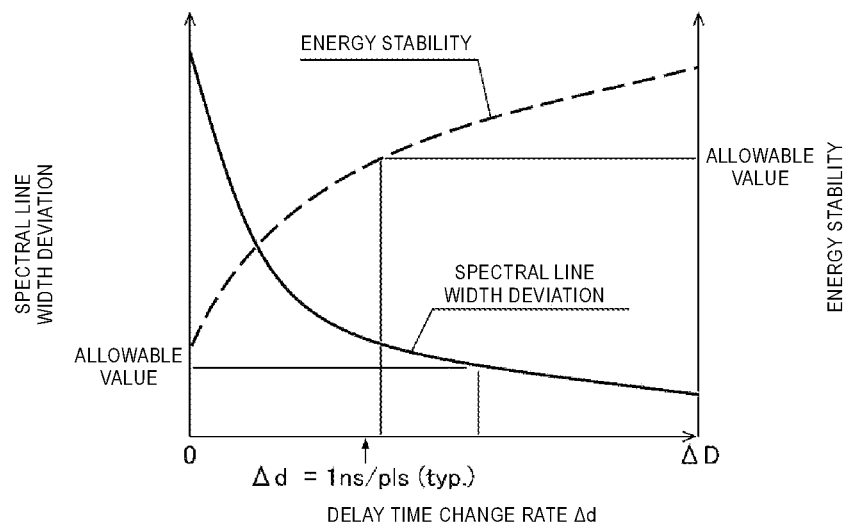
FIG. 11 is an example of a graph showing the relationship between the delay time change rate and each of the spectral line width deviation and the energy stability, and shows an example of a case in which the delay time change rate cannot be set to allow the spectral line width deviation and the energy stability to have the respective allowable values.

The delay time change rate Δd is preferably selected to be a value such that the characteristic as shown in FIG. 10 is acquired in advance, and, for example, both the spectral line width deviation and the energy stability are to have the respective allowable values. Alternatively, as shown in FIG. 11, when both the spectral line width deviation and the energy stability cannot be satisfied, the delay time change rate Δd may be selected to be a value (1 ns/pls as a typical value) such that, for example, the spectral line width is improved as much as possible in a range in which the energy stability is to have the allowable value.

At this time, although the spectral line width deviation is not to have the allowable value only by the present method, the shortage may be compensated by a spectral line width control unit (not shown). For example, compensation may be performed by a spectral line width control mechanism that changes the wavefront in the MO resonator to change the spectral line width.

Other operation may be similar to that of the first embodiment.

4.3 Effect

According to the laser device 1 of the second embodiment, similarly to the first embodiment, the change in the pulse energy due to the change in the delay time D becomes gradual, and the deviation from the target range is suppressed.

By determining the delay time change rate Δd according to the operation conditions such as the repetition frequency and/or the characteristics of the laser light, it is possible to suppress deviation from the target range due to the change in the pulse energy becoming insufficiently gradual, or a decrease in the response due to the change becoming more gradual than necessary.

5. Third Embodiment

5.1 Configuration

The configuration of the laser device 1 according to a third embodiment may be similar to that shown in FIG. 1.

5.2 Operation

Regarding the operation of the third embodiment, differences from that of the first embodiment will be described. In the third embodiment, the delay time change rate Δd in the operation described in the first embodiment is dynamically (adaptively) set according to the target value ΔD of the delay time change amount. That is, the delay time change rate Δd in the third embodiment is set so that the delay time change amount reaches the target value ΔD within a predetermined number of pulses N (e.g., N=5pls). For example, Δd=ΔD/N is set so that ΔD is reached in N pulses. The predetermined number of pulses N may be set to a value of, for example, 2 pulses or more and 10 pulses or less. Other operation may be similar to that of the first embodiment.

5.3 Effect

According to the laser device 1 of the third embodiment, similarly to the first embodiment, the change in the pulse energy due to the change in the delay time D becomes gradual, and the deviation from the target range is suppressed. Further, according to the laser device 1 of the third embodiment, it is ensured that the change in the delay time D is completed after the predetermined number of pulses N elapses. Therefore, the third embodiment is useful, for example, in a case in which the spectral line width is not an evaluation target during the period of N pulses from the start of oscillation.

6. Other Application Examples

In the first to third embodiments described above, the change of the repetition frequency has been described as an example, but the present invention is not limited thereto, and other operation conditions may be changed. Further, the spectral line width is an example of the characteristics of the laser light, and the delay time D may be changed to suppress fluctuation of other characteristics. The technique of laser control according to the present disclosure can be applied to control of "reducing characteristic variation (fluctuation) of laser light by changing the delay time D in accordance with the operation conditions." When the delay time D is changed in accordance with the change of the operation conditions, by gradually changing the delay time D over a plurality of pulses, it is possible to suppress the deviation from the target range of the characteristics of the laser light.

7. Electronic Device Manufacturing Method

Figure 12:
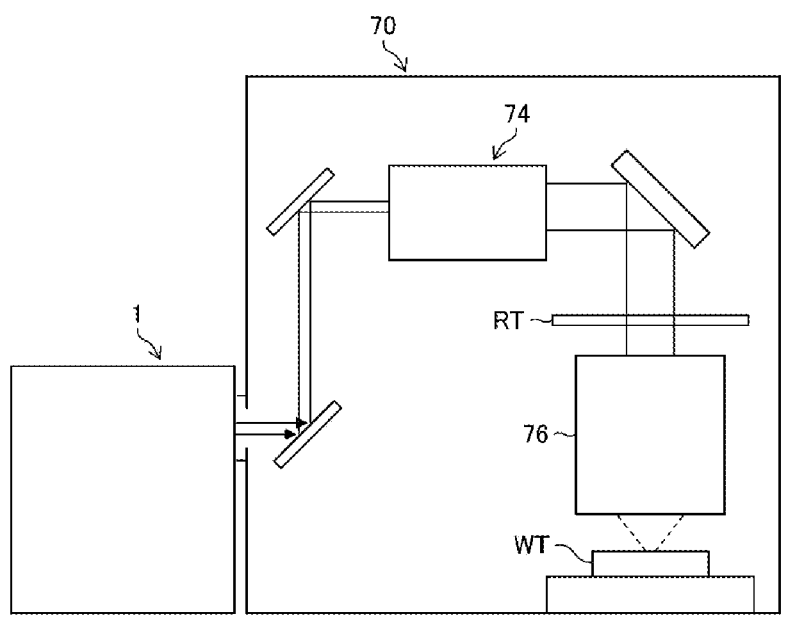
FIG. 12 schematically shows a configuration example of an exposure apparatus.

FIG. 12 schematically shows a configuration example of the exposure apparatus 70. The exposure apparatus 70 includes an illumination optical system 74 and a projection optical system 76. The illumination optical system 74 illuminates a reticle pattern of a reticle (not shown) arranged on a reticle stage RT with laser light incident from the laser device 1. The projection optical system 76 causes the laser light transmitted through the reticle to be imaged as being reduced and projected on a workpiece (not shown) arranged on a workpiece table WT. The workpiece is a photosensitive substrate such as a semiconductor wafer on which photoresist is applied.

The exposure apparatus 70 synchronously translates the reticle stage RT and the workpiece table WT to expose the workpiece to the laser light reflecting the reticle pattern. After the reticle pattern is transferred onto the semiconductor wafer by the exposure process described above, a semiconductor device can be manufactured through a plurality of processes. The semiconductor device is an example of the "electronic device" in the present disclosure.

8. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser device comprising:
   a master oscillator configured to output pulse laser light at a first discharge timing synchronized with a repetition frequency;
   an amplifier configured to amplify the pulse laser light by exciting, at a second discharge timing, a laser medium through which the pulse laser light passes; and
   a processor configured to set the second discharge timing by adding a delay time to the first discharge timing, hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

2. The laser device according to claim 1, wherein the third value is changed for each pulse over a plurality of pulses.

3. The laser device according to claim 1, wherein, after outputting the command value of the first value, the processor outputs the command value while gradually changing the third value over a plurality of pulses.

4. The laser device according to claim 1, wherein, when the repetition frequency is changed from the first repetition frequency to the second repetition frequency, the command value is gradually changed from the first value to the second value over a plurality of pulses.

5. The laser device according to claim 4, wherein a change amount per pulse of the command value to be gradually changed over the plurality of pulses is constant.

6. The laser device according to claim 4, wherein a change amount per pulse of the command value to be gradually changed over the plurality of pulses is determined depending on the first repetition frequency and the second repetition frequency.

7. The laser device according to claim 4, wherein a change amount per pulse of the command value to be gradually changed over the plurality of pulses is determined to be a value such that both spectral line width deviation and energy stability of pulse energy are to have respective allowable values.

8. The laser device according to claim 4, wherein a change amount per pulse of the command value to be gradually changed over the plurality of pulses is determined to be a value such that one of spectral line width deviation and energy stability of pulse energy is to have an allowable value.

9. The laser device according to claim 4, wherein a change amount per pulse of the command value to be gradually changed over the plurality of pulses is determined such that the second value is reached within a predetermined number of pulses after the command value of the first value is output.

10. The laser device according to claim 9, wherein the predetermined number of pulses is 5.

11. The laser device according to claim 4, wherein, when a target value of a change amount of the command value from the first value to the second value is $\Delta D$ and a predetermined number of pulses is N, the processor sets a change amount $\Delta d$ per pulse of the command value to be gradually changed over the plurality of pulses to satisfy $\Delta d = \Delta D/N$.

12. The laser device according to claim 1, wherein the processor holds a relationship between the repetition frequency and the command value as table data, and specifies the first value and the second value based on the table data.

13. The laser device according to claim 1, wherein the processor holds a relationship between the repetition frequency and the command value as table data, and determines a change amount of the command value with reference to the table data when the repetition frequency is changed from the first repetition frequency to the second repetition frequency.

14. The laser device according to claim 1, wherein the processor controls an excitation voltage of the amplifier to stabilize a pulse energy of the pulse laser light.

15. The laser device according to claim 14, wherein, when the repetition frequency is changed from the first repetition frequency to the second repetition frequency, the processor gradually changes the excitation voltage over a plurality of pulses for which the command value of the third value is output.

16. The laser device according to claim 1,
wherein the amplifier includes a chamber in which a mixed gas including a rare gas, a halogen gas, and a buffer gas as the laser medium is contained.

17. A laser oscillation method comprising:
outputting pulse laser light from a master oscillator at a first discharge timing synchronized with a repetition frequency;
amplifying the pulse laser light by exciting, at a second discharge timing, a laser medium through which the pulse laser light passes; and
setting, by a processor, the second discharge timing by adding a delay time to the first discharge timing,
the processor being configured to hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

18. An electronic device manufacturing method, comprising:
generating laser light using a laser device;
outputting the laser light to an exposure apparatus; and
exposing a photosensitive substrate to the laser light in the exposure apparatus to manufacture an electronic device,
the laser device including:
a master oscillator configured to output pulse laser light at a first discharge timing synchronized with a repetition frequency;
an amplifier configured to amplify the pulse laser light by exciting, at a second discharge timing, a laser medium through which the pulse laser light passes; and
a processor configured to set the second discharge timing by adding a delay time to the first discharge timing, hold a first value as a command value of the delay time corresponding to a first repetition frequency, hold a second value as the command value of the delay time corresponding to a second repetition frequency different from the first repetition frequency, and output the command value of the second value after outputting the command value of a third value between the first value and the second value when the repetition frequency is changed from the first repetition frequency to the second repetition frequency after outputting the command value of the first value.

* * * * *